United States Patent [19]

Maile

[11] Patent Number: 4,663,521

[45] Date of Patent: May 5, 1987

[54] INFRARED RADIATION CONTROLLED SWITCH WITH A VISIBLE LIGHT DETECTOR

[75] Inventor: Donald W. Maile, Lancaster, Pa.

[73] Assignee: RCA Corporation, Princeton, N.J.

[21] Appl. No.: 702,377

[22] Filed: Feb. 15, 1985

[51] Int. Cl.$^4$ ............................................. G01V 9/04
[52] U.S. Cl. .............................. 250/221; 250/214 AL; 340/567
[58] Field of Search ................ 340/565, 567; 250/340, 250/342, 221, 222.1, 214 Al, 214 B, 214 R; 315/155

[56] References Cited

U.S. PATENT DOCUMENTS

| | | | |
|---|---|---|---|
| 3,703,718 | 11/1972 | Berman | 340/258 |
| 3,745,550 | 7/1973 | Anthony et al. | 250/221 |
| 3,901,813 | 8/1975 | Potopinski | 250/214 AL |
| 3,958,118 | 5/1976 | Schwarz | 250/221 |
| 4,042,853 | 8/1977 | Duve | 315/155 |
| 4,179,691 | 12/1979 | Keller | 340/567 |
| 4,342,987 | 8/1982 | Rossin | 340/567 |
| 4,344,071 | 8/1982 | Allen | 340/566 |
| 4,346,427 | 8/1982 | Blissett et al. | 361/173 |
| 4,364,030 | 12/1982 | Rossin | 340/567 |
| 4,377,808 | 3/1983 | Kao | 340/527 |

Primary Examiner—David C. Nelms
Attorney, Agent, or Firm—Eugene M. Whitacre; William J. Burke

[57] ABSTRACT

An electric switch has an infrared radiation detector and a visible light detector. The switch is activated when both a change in the detected infrared radiation is sensed and the sensed visible light has a given relationship to a predetermined intensity level. An adjustment of the predetermined level is provided whereby the switch is activated when the level is set to the visible light intensity at the time the adjustment is made.

6 Claims, 1 Drawing Figure

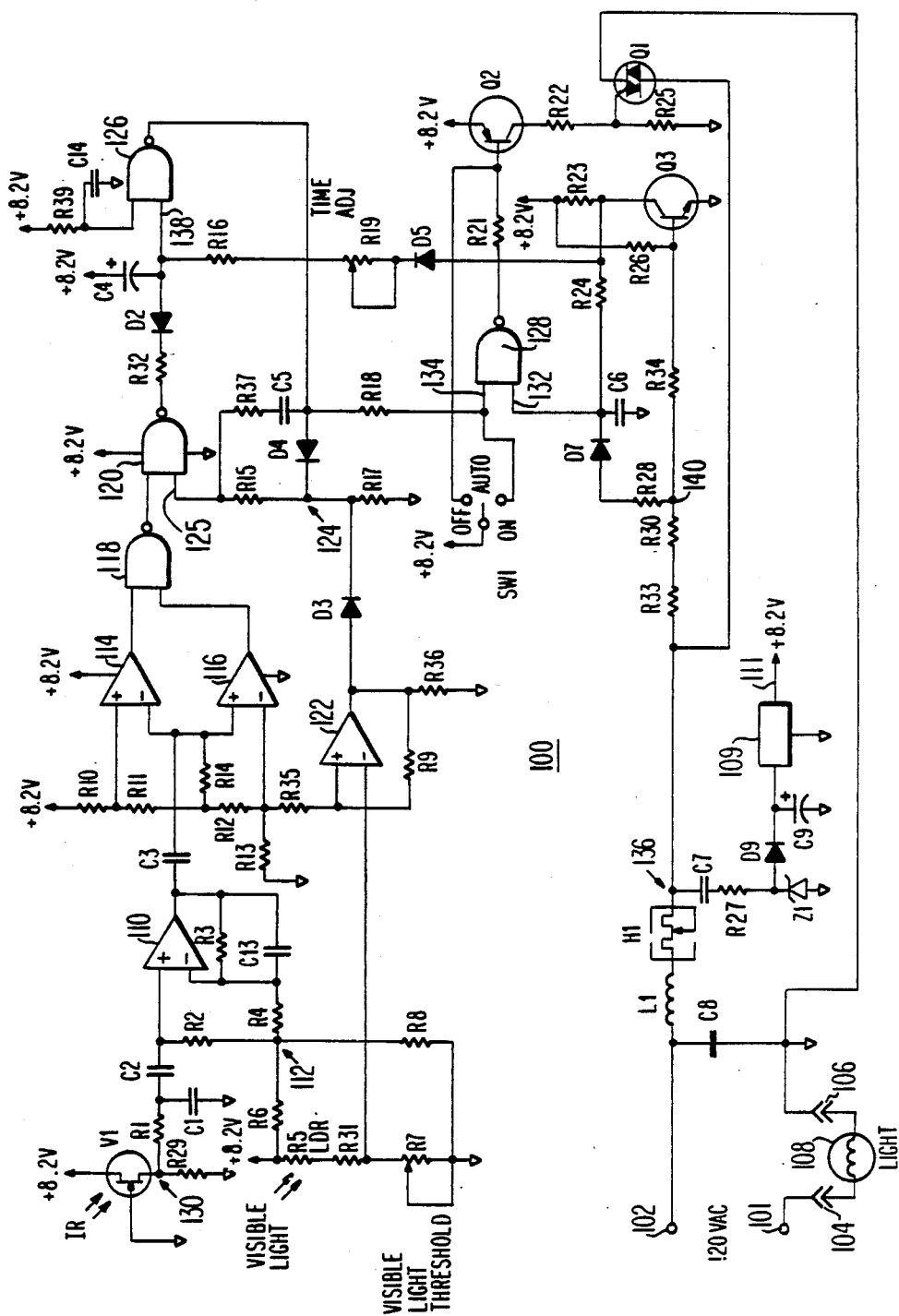

INFRARED RADIATION CONTROLLED SWITCH WITH A VISIBLE LIGHT DETECTOR

The present invention relates to electrical controls which are activated by an infrared light detector.

BACKGROUND OF THE INVENTION

Infrared detectors have been used to control lights and other electrical appliances. Such devices detect the change in the infrared radiation (heat) level within an area and activate the electrical appliance or sound an intrusion alarm. Typically, the change in heat results from a person entering or moving within the sensing area. The appliance remains turned on for a predetermined period of time after which, if no further change in the infrared level has occurred, the appliance goes off.

One problem encountered in certain types of these switches is that if the light or appliance is located within the sensing area, when the appliance is turned off, its cooling down may be detected and repeatedly triggers an activation cycle. It is not always practical to eliminate this problem by positioning the appliance outside the sensing area or by proper aiming of the detector.

Certain types of these infrared activated switches incorporate a visible light detector, so that the appliance is only activated if a person enters the room when the ambient light is below a given level. The given ambient light threshold level may be adjusted so that the switch activates the light only at night. In the past, the operator when setting that level, has not had any indication of when it is properly set, unless the heat pattern is also changing within the sensor area.

SUMMARY OF THE PRESENT INVENTION

An electric control has an infrared radiation detector and means for producing a control signal in response to changes in the radiation sensed by the detector. Means is provided for activating the control in response to the control signal only when the ambient visible light is below a given level. Also included is a means for adjusting that given level and means for activating the control when the given level is adjusted to the ambient light level at the time the adjustment is made.

BRIEF DESCRIPTION OF THE DRAWING

The FIGURE is a schematic diagram of an electrical appliance switch incorporating the present invention.

DETAILED DESCRIPTION OF THE INVENTION

With reference to the FIGURE, an infrared operated appliance switch 100 has first and second power terminals 101 and 102 to which 120 volt alternating current is applied. A first appliance terminal 104 is connected to the first power terminal 101 and a second appliance terminal 106 is connected to the system ground, which in this case is not the same as earth ground. An electrical appliance, such as light 108, may be connected between the appliance terminals 104 and 106.

Capacitor C8 is connected between the system ground and the second power terminal 102. An RF filter inductor L1 has a first terminal connected to the second power terminal 102 and a second terminal connected to one lead of a thermal circuit breaker H1 which may be mounted on a heat sink (not shown). Another lead of the circuit breaker is connected to a lead of capacitor C7 at node 136. Resistor R27 extends between the other lead of capacitor C7 and the cathode of zener diode Z1 which has its anode connected to the system ground. The anode of diode D9 is connected to the cathode of zener diode Z1 and the cathode of diode D9 is connected to the input terminal of a voltage regulator 109. Capacitor C9 extends between the input terminal of the voltage regulator 109 and the system ground. The output terminal 111 of voltage regulator 109 provides the positive voltage source, in this case +8.2 volts, for the appliance switch 100.

An infrared FET phototransistor V1 has its source-drain conduction path connected in series with resistor R29 between the system ground and the positive voltage source. The gate of transistor V1, which in this case is an N channel device, is connected directly to the system ground. Resistor R1 has one terminal connected to node 130 between transistor V1 and resistor R29. The other terminal of R1 is coupled to one lead of capacitor C2 having its second lead connected to the noninverting input terminal of a operational amplifier (op amp) 110. Capacitor C1 extends between the other terminal of R1 and the system ground. The inverting input of the op amp 110 is coupled through resistor R4 to a node 112. Resistor R2 extends between node 112 and the noninverting input terminal of the op amp 110 and resistor R6 couples node 112 to the positive voltage source. Resistor R8 extends between the system ground and node 112. Parallel connected resistor R3 and capacitor C13 are connected across the output of op amp 110 and its inverting input terminal.

Coupling capacitor C3 extends between the output terminal of the operational amplifier 110 and both the inverting input terminal of a differential amplifier 114 and the noninverting input terminal of a differential amplifier 116. Resistors R10, R11, R12 and R13 are connected in series to form a voltage divider between the positive voltage source and the system ground. The node between resistors R10 and R11 is connected to the noninverting input terminal of differential amplifier 114. Resistor R14 couples the node between resistors R11 and R12 to both the inverting input terminal of differential amplifier 114 and the noninverting input terminal of differential amplifier 116. The inverting input terminal of the differential amplifier 116 is directly coupled to the node between resistors R12 and R13. The outputs of differential amplifiers 114 and 116 are connected to separate input terminals of a first dual input NAND gate 118 whose output is in turn coupled to one input of a second NAND gate 120.

A visible light dependent resistor (LDR) R5, as shown in the left portion of the FIGURE, has one terminal connected to the positive voltage source and another terminal connected to resistance R31. The resistance of the LDR is inversely proportional to the intensity of light striking it. The other terminal of resistor R31 is connected to the system ground through a variable resistor R7 and to the inverting input terminal of differential amplifier 122.

The noninverting input terminal of differential amplifier 122 is biased by resistor R35 connected to the node between resistors R12 and R13. Feedback resistor R9 couples the output of differential amplifier 122 to its noninverting input terminal. Resistor R36 extends between the output of differential amplifier 122 and the system ground. Diode D3 has its anode connected to the output of differential amplifier 122 and has its cathode connected to node 124. Resistor R17 couples node 124 to the system ground and resistor R15 connects the other input terminal 125 of the second NAND gate 120 to node 124.

Resistor R32 connects the output of the second NAND gate 120 to the cathode of diode D2. The anode of diode D2 is connected to one input terminal 138 of a third dual input NAND gate 126. Capacitor C4 is connected between the positive voltage source and the one input 138 to NAND gate 126. The other input of NAND gate 126 is connected through resistor R39 to the positive voltage source. Capacitor C14 extends between the system ground and the other input of NAND gate 126. The output of the third NAND gate 126 is connected through resistor R18 to one input terminal 134 of a fourth NAND gate 128. Diode D4 has its anode connected to the output of the third NAND gate 126 and its cathode connected to node 124. Series connected resistor R37 and capacitor C5 extend between the output of the third NAND gate 126 and the other input terminal 125 of the second NAND gate 120.

One conducting, or main, terminal of a triac Q1 is connected to node 136 and the other conducting terminal is connected to the system ground. Triac Q1 is mounted on the same heat sink as the circuit breaker H1 (not shown). The heat sink is sized so that the thermal circuit breaker H1 will trip before the maximum current rating of the triac is exceeded. Series resistors R30 and R33 extend between nodes 136 and 140. Resistor R28 is connected between node 140 and the anode of diode D7. The cathode of diode D7 is connected to the other input terminal 132 of the fourth NAND gate 128. The other input terminal 132 is also coupled through capacitor C6 to the system ground.

Node 140 is also connected through resistor R34 to the base of NPN transistor Q3 whose emitter is connected to the system ground. The base of transistor Q3 is connected through bias resistor R26 to the positive voltage source and the collector of transistor Q3 is also connected through bias resistor R23 to the positive voltage source. The anode of diode D5 is connected to the collector of transistor Q3. The cathode of diode D5 is coupled to input terminal 138 of the third NAND gate 126 through the series connection of variable resistor R19 and resistor R16. Resistor R24 is connected across the collector of transistor Q and terminal 132 of the fourth NAND gate 128.

The output of the fourth NAND gate 128 is coupled through resistor R21 to the base of a PNP transistor Q2. The emitter of transistor Q2 is connected to the positive voltage source and the collector is connected to the system ground through the series connection of resistors R22 and R25. The node between resistors R22 and R25 is connected to the gate of the triac Q1.

A single pole double throw switch SW1 with a center off position has its blade connected to the positive voltage source. The terminal of switch SW1 designated OFF is directly connected to the base of transistor Q2 and the terminal designated ON is directly connected to input terminal 134 of NAND gate 128.

A device utilizing the present invention may control an appliance or, as shown in the FIGURE, an electric light 108. The control switch 100 detects a change in the infrared radiation or heat level in a given area and activates the appliance if the heat has changed, either increased or decreased. The circuit is designed to react to relatively fast heat changes, such as when a person enters the area, rather than slower changes due to solar heating. Depending upon the detector used, movement of a heat source within the sensing area can also be detected. In addition, the level of ambient visible light is detected so that the switch will only activate if the visible light in the area is below a certain adjustable level.

With reference to the FIGURE, if the infrared radiation in the sensing area increases, then the response of infrared detector V1 will cause an increase of the voltage at node 130. A decrease of the infrared radiation will cause a decrease in the voltage at node 130. This change in voltage is amplified by the high gain op amp 110 having an output signal which is fed to differential amplifiers 114 and 116. The amplified voltage change is connected to the inverting input terminal of differential amplifier 114 and the noninverting input terminal of differential amplifier 116. The two differential amplifiers are biased such that in the quiescent state of the infrared switch 100, where no change in heat is detected, the noninverting input terminal of differential amplifier 116 is at a higher voltage than that applied to its inverting input terminal. This voltage difference may be on the order of 180 millivolts for good sensitivity of the switch. Differential amplifier 114 has a lower voltage applied to its inverting input terminal than the voltage at its noninverting input terminal. In this quiescent state, the output of both of these differential amplifiers is a high output level which when coupled to the first NAND gate 118 produces a low output from the NAND gate. This low output does not permit the output state of the second NAND gate 120 to change.

If, however, the IR detector V1 senses a change in the level of infrared radiation (i.e., heat) in the sensing area, the output of op amp 110 will change the common input voltage at the inverting input terminal of differential amplifier 114 and the noninverting input terminal of differential amplifier 116. (1) If more heat is detected, the voltage at the common amplifier inputs will increase. Once the voltage at the inverting input terminal of differential amplifier 114 increases above the bias voltage at its noninverting input terminal, the amplifier 114 will produce a low output level which will trigger the first NAND gate 118 to produce a high output level if the other NAND gate input is also low. (2) If less heat is detected in the room, the voltage at the common input terminals to differential amplifiers 114 and 116 will decrease. If the voltage at the noninverting input terminal of amplifier 116 decreases below the bias voltage at its inverting input terminal, it will produce a low output which in turn also will cause a high output to be produced from the first NAND gate 118 if its other input is also low.

The ambient visible light intensity is detected by light dependent resistor R5. The voltage divider formed by resistors R5, R31 and R7 bias the inverting input of differential amplifier 122. The resistance of variable resistor R7 sets a brightness threshold. Once the ambient visible light drops below that threshold level, the voltage at the inverting input terminal of differential amplifier 122 will be less than the voltage at its other input terminal, thereby producing a high output. This high output is coupled to the other input of NAND gate 120 through diode D3 and resistor R15. Alternatively the inputs to the differential amplifier 122 could be reversed so that it produces a high output when the visible light exceeds the given threshold setting. Thus, different devices could be provided to generate the switch upon various ambient light relationships.

In order for the appliance switch 100 to activate (i.e. turn on the appliance), both of the inputs to the second NAND gate 120 must be high. That is, the ambient visible light detected by the light dependent resistor R5 must be below the threshold and the infrared detector V1 must detect a change in the infrared radiation level. If both of these conditions are satisfied (i.e., NAND gate 120 inputs are both high), the second NAND gate 120 will produce a low output which charges capacitor C4 and produces a high output from the third NAND gate 126. The high output from NAND gate 126 is coupled through resistor R18 to input 134 of the fourth NAND gate 128.

It is readily appreciated by one skilled in the art that in certain applications, the detector logic could be inverted so that a high output from NAND gate 126 could turn off a normally turned on appliance when a change in radiation is detected.

The other input terminal 132 of NAND gate 128 receives signals from two sources. One source is from the AC line through resistors R33, R30 and R28 and diode D7. The values of these cause input 132 to reach its threshold when the incoming line voltage across terminals 101 and 102 is above a positive value, for example seventy volts. At this time, the output of NAND gate 128 goes low, turning on transistor Q2 which turns on the triac Q1, applying the remainder of the positive half cycle of the AC line voltage to the light 108.

The other input signal source to input 132 of NAND gate 128 is from the collector of transistor Q3. The collector is normally at nearly zero volts due to current flowing through resistor R26 biasing the base and causing saturation of transistor Q3. When the incoming AC line voltage reaches a negative threshold value, for example sixty-five volts, the base current is removed from transistor Q3, causing its collector to go to a positive voltage. The collector signal is coupled to terminal 132 of NAND gate 128 through a time delay circuit provided by resistor R24 and capacitor C6. Because of the collector signal time delay, terminal 132 reaches its threshold approximately fifty microseconds after the collector of transistor Q3 goes positive. At this time the output of NAND gate 128 goes low turning on transistor Q2 and therefor triac Q1 applying the remainder of the negative half cycle of the AC line voltage to the light 108.

After the light 108 has been activated by the IR detector V1, if the infrared radiation level in the sensing area stops changing, i.e. remains steady, the output of the second NAND gate 120 goes high. However, input 138 of the third NAND gate 126 does not immediately go high because the high output from NAND gate 120 is blocked by reverse biased diode D2. During every negative half cycle of the AC line voltage, a positive pulse is produced at the collector of transistor Q3 when it turns off. This positive pulse is applied through diode D5 and resistors R19 and R16 to partially discharge capacitor C4, if the output of NAND gate 120 is high (i.e., D2 is non-conducting). The positive pulse has a duration of approximately fifty microseconds, lasting from the time that the negative half cycle of the AC line voltage cuts off transistor Q3 until the triac Q1 turns on. As this pulse occurs once every 16,667 microseconds, long discharge times are possible using reasonably sized components in the RC circuit formed by resistors R16 and R19 and capacitor C4. The time constant of the RC circuit is adjusted by R19. Once a certain positive voltage level threshold has been reached at the input 138 of the third NAND gate 126, its output goes low which results in light 108 turning off. Therefore, the light stays on for a time period set by the RC time constant. At that point in time if there is no further heat change in the sensing area, the light remains off. Subsequent changes in the infrared level will reactivate the light. If the output of NAND gate 120 goes low again during the time delay period, capacitor C4 will recharge, therby resetting the RC circuit timing cycle.

Diode D4 clamps node 124 and hence the input 125 of NAND gate 120, which is connected to node 124, to a high level when the light is on. This clamping prevents the light dependent resistor R5 upon sensing the light 108 illumination, from turning off the light after one cycle even though the infrared radiation is changing. This illumination could exceed the visible light threshold resulting in the circuit reacting as though the natural ambient light intensity had reached the brightness level above that at which electric control switch 100 is set to operate. Diode D4 provides a feedback path to the output from NAND gate 126 which disables the output of amplifier 122 from affecting the state of NAND gate 120 during the on period of the light 108.

This feedback clamping is further enhanced by resistor R37 and capacitor C5. One of the problems that has been detected with this type of infrared light switch is that if the switched light 108 is within the field of view of the infrared detector V1, as the light cools down after being turned off, its cooling will be detected as a change in heat which will turn the light back on, producing an endless cycle. Capacitor C5 and resistors R15 and R37 define a time period, after the light 108 has been turned off, during which period the circuit ignores any change in the infrared radiation level detected by V1. Assuming the following component values: resistor R15 9.1 megohms, resistor R37 10 kilohms and capacitor C5 0.1 microfarads; when the output of NAND gate 126 is high (light on) capacitor C5 will be charged to approximately 0.6 volts (the voltage drop across diode D4). At the time when the NAND gate 126 goes low, turning the light off, input terminal 125 of NAND gate 120 will be driven to −0.6 volts by the charge on capacitor C5. Then, if the visible light is below the set threshold, the voltage at terminal 125 will slowly rise to about +8 volts as capacitor C5 charges due to the high voltage level from amplifier 122 applied through diode D3 and resistors R15 and R37. During the time that input 125 terminal is below its threshold voltage, any changes at the other input terminal of NAND gate 120 will have no effect on its output. Therefore, the output of NAND gate 118 from the IR dectector circuit will be disabled from activating the control switch 100. This period when the IR control is disabled permits the light 108 or other heat generating appliance connected to terminals 104 and 106 to cool down before the detection of new changes in heat is used to control the switch. Alternatively, the time delay circuit could include means for adjusting the time period to allow the time period to be set for the particular electrical appliance.

At the particular time of day when the ambient visible light is at a level below that which the user wishes to have the switch 100 activate, the user adjusts resistor R7 to set the visible light threshold. When the threshold is set for the current brightness level, the light comes on. The output of differential amplifier 122 is coupled through feedback resistor R9 to its noninverting input. This feedback path continues through resistor R35 to the inverting input of differential amplifier 116. When R7 is adjusted to the the current visible light level, the output of differential amplifier 122 will be at a high voltage level which when coupled to the noninverting input of differential amplifier 116 will produce a momentary high output pulse. This high pulse in turn produces a low output pulse from NAND gate 120, activating the switch 100. The instant that differential amplifier 122 goes high, the inverting input of differential amplifier 116 will be higher than its noninverting input and the light 108 will cycle on for one time period then go off. This enables the user to get an immediate indication of when the visible light threshold resistor R7 has been properly set for the ambient light level at the time the adjustment is being made.

I claim:

1. In an electric controller having an infrared radiation detector, means for producing a control signal in response to changes in radiation sensed by the detector, means for generating an output signal upon the presence of the control signal when the ambient visible light intensity has a predetermined relationship to a given brightness level, the improvement comprising:
    means for adjusting the given level; and
    means for providing an indication of when the given level is adjusted to the intensity of ambient light at the time the adjustment is made independent of changes in radiaiton sensed by the detector.

2. The controller as in claim 1 wherein said indication is the generation of said output signal.

3. The controller as in claim 1 wherein the predetermined relationship is where the ambient visible light intensity is below the given brightness level.

4. In a switch for an electric appliance, said switch having an infrared radiation detector, means for producing a control signal in response to changes in radiation sensed by the detector, means for activating the switch upon the presence of the control signal when the ambient visible light is below a given intensity level, the improvement comprising:
    means for adjusting the given level; and
    means for activating the appliance switch when the given level is adjusted to the level of ambient light at the time the adjustment is made independent of changes in radiation sensed by the detector.

5. In an electric controller having an infrared radiation detector, means for producing a control signal in response to changes in radiation sensed by the detector, means for changing the output of the controller from a first state to a second state upon the presence of the control signal when the ambient visible light intensity has a predetermined relationship to a given level, the improvement comprising:
    means for adjusting the given level; and
    means for changing the output of the controller from the first state to the second state when the given level is adjusted to the intensity of ambient light at the time the adjustment is made independent of changes in radiation sensed by the detector.

6. The control as in claim 5 wherein the predetermined relationship is where the visible light intensity is below the given level.

* * * * *